US008077062B2

(12) United States Patent
Rajendran et al.

(10) Patent No.: US 8,077,062 B2
(45) Date of Patent: *Dec. 13, 2011

(54) PACK ASCII ZSERIES INSTRUCTIONS

(75) Inventors: Antonisamy A. Rajendran, Bangalore (IN); Muruganandam Somasundaram, Chennai (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/767,207

(22) Filed: Apr. 26, 2010

(65) Prior Publication Data

US 2010/0205526 A1   Aug. 12, 2010

Related U.S. Application Data

(63) Continuation of application No. 12/715,017, filed on Mar. 1, 2010, now Pat. No. 7,868,791, and a continuation of application No. 12/182,377, filed on Jul. 30, 2008, now abandoned, and a continuation of application No. 11/676,568, filed on Feb. 20, 2007, now Pat. No. 7,408,484.

(51) Int. Cl.
   *H03M 7/00*   (2006.01)
(52) U.S. Cl. ............................................ 341/60; 341/51
(58) Field of Classification Search .................... 341/60, 341/51, 106; 709/219, 236; 717/117, 138; 715/542; 707/758
See application file for complete search history.

(56) References Cited

U.S. PATENT DOCUMENTS

| 5,301,285 | A | 4/1994 | Hanawa |
| 6,039,765 | A | 3/2000 | Trissel |
| 6,163,764 | A | 12/2000 | Dulong et al. |
| 6,215,992 | B1 | 4/2001 | Howell |
| 6,701,320 | B1 | 3/2004 | Marple |
| 6,999,082 | B2 | 2/2006 | Nishimura |
| 7,073,264 | B2 | 7/2006 | Votolato |
| 7,092,869 | B2 | 8/2006 | Hilton |
| 7,167,968 | B2 | 1/2007 | Busaba et al. |
| 7,353,287 | B2 | 4/2008 | Parent et al. |
| 7,394,409 | B1 | 7/2008 | Rajendran et al. |
| 7,408,484 | B1 | 8/2008 | Rajendran |
| 7,868,791 | B2 | 1/2011 | Rajendran et al. |
| 2003/0093649 | A1 | 5/2003 | Hilton |
| 2005/0238010 | A1 | 10/2005 | Panigrahy |
| 2008/0263291 | A1 | 10/2008 | Rajendran et al. |
| 2008/0301416 | A1 | 12/2008 | Rajendran |

OTHER PUBLICATIONS

"z/Architecture—Principles of Operation," IBM Publication No. SA22-7832-03, 4th Edition, May 2004 (Pack Unicode and Unpack Unicode instructions—Chapter 7 & Packed Format—Chapter 8).

(Continued)

*Primary Examiner* — Peguy Jean Pierre
(74) *Attorney, Agent, or Firm* — John E. Campbell; Blanche E. Schiller, Esq.; Heslin Rothenberg Farley & Mesiti P.C.

(57) ABSTRACT

ASCII input data to be packed into memory is obtained. The ASCII input data includes a plurality of blocks of ASCII data, wherein each block of ASCII data includes a plurality of ASCII characters. A block of ASCII data to he packed is selected. The selected block is chosen from the plurality of blocks of ASCII data and includes a plurality of bytes of data. One or more operations are performed on the selected block of ASCII data to obtain a plurality of bytes of packed data. The selecting and the performing are repeated one or more times for a next selected block to obtain a packed array for the input data.

20 Claims, 5 Drawing Sheets

OTHER PUBLICATIONS

"z/Architecture—Principles of Operation," IBM Publication No. SA22-7832-04, 5th Edition, Sep. 2005.
Office Action for U.S. Appl. No. 11/676,568 dated Jan. 17, 2008.
Office Action for U.S. Appl. No. 12/182,377 dated Dec. 24, 2008.
Final Office Action for U.S. Appl. No. 12/182,377 dated Mar. 16, 2009.
Office Action for U.S. Appl. No. 11/676,538 dated Jan. 9, 2008.
U.S. Appl. No. 12/715,017 entitled "Pack Unicode ZSeries Instructions," Rajendran et al., filed Mar. 1, 2010.

PACK ASCII ZSERIES INSTRUCTIONS

This application is a continuation of co-pending U.S. patent application Ser. No. 12/715,017, filed Mar. 1, 2010, entitled "Pack Unicode ZSeries Instructions," by Rajendran et al., which is a continuation of U.S. Ser. No. 12/182,377, filed Jul. 30, 2008, entitled "System and Program Product of Doing Pack Unicode ZSeries Instructions," by Rajendran et al., which is a continuation of U.S. Pat. No. 7,408,484, issued Aug. 5, 2008, entitled "Method of Doing Pack Unicode ZSeries Instructions," by Rajendran et al., the entirety of each of which is hereby incorporated herein by reference.

BACKGROUND

The present invention relates in general to systems, program products and methods for emulating the computer instructions found in a source computer architecture in which sequences of instructions on a target machine architecture are generated so as to produce the same results on both computer architectures. More particularly, the present invention is related to methods and systems for emulating PACK instructions for ASCII character strings. Even more particularly, the present invention is directed to emulation methods in which computer instructions found on zSeries machines are emulated on other computer architectures, notably the Intel x86 series of microprocessors and the PowerPC series of microprocessors. The present description also includes methods and systems for emulating the PACK Unicode instruction.

As is well known, the Unicode standard for character representation is a two byte ("double byte" in some terminology) system in which each character is represented by 16 bits or two bytes of information. This standard provides a vastly expanded range of representable characters including those from languages in which ideographs are employed to represent words and ideas as opposed to the use of individual letters. This is in distinction to ASCII or EBCDIC character representations which provide a maximum of 255 characters or signal indicators.

It is also known that each byte (eight bits) in a data processing system can represent two decimal numbers. However, it is often the case that decimal numbers are provided in a format in which each byte contains a representation of but one decimal number. It is therefore convenient to be able to PACK decimal numbers (or other data) into a packed format, that is, from a one-decimal-digit-per-byte format to a two-decimal-digit-per-byte format. This is typically accomplished with some form of PACK instruction which is structured as a basic member of the set of a computer's instruction set. These instructions usually come in PACK/UNPACK pairs.

Also relevant to the present discussion are the notions of big-endian and small-endian. These concepts relate to the position in the memory architecture where the high order byte portion of an integer (or other data) is stored. In the big-endian scheme, the most significant byte of the integer is stored in the memory location with the lowest address. In the small-endian scheme, the most significant byte of the integer is stored in the memory location with the highest memory address. The Intel x86 processors and chips which seek to duplicate their functionality, such as those produced by Advanced Micro Devices, Inc., use the small-endian (also called little-endian) format. The zSeries of machines and most of the PowerPC devices employ the big-endian format.

PKU is an instruction present in the very well known zSeries computer architecture as found in products manufactured and sold by the assignee of the present invention. Descriptions of this and other instructions are found in any of the Principles of Operation (PoP) manuals published as accompanying documentation for the aforementioned data processing machine products. This particular instruction converts a Unicode string to a packed format. The format of the PKU instruction is "PKU TARGET, SOURCE (L2)" where L2 is the Length of the second operand ($0 \leq L2 \leq 63$). The length of the target is always 16 bytes. A sample program included herein as Appendix I provides a description of an approach to providing emulation code for the PKU (Pack Unicode) instruction. Appendix I thus illustrates a block level algorithm that is used herein.

The format of the second operand is changed from Unicode to packed, and the result is placed at the first-operand location. The packed format is described in Chapter 8, "Decimal Instructions."

The two-byte second-operand characters are treated as Unicode Basic Latin characters containing decimal digits, having the binary encoding 0000-1001 for 0-9, in their rightmost four bit positions. The leftmost 12 bit positions of a character are ignored. The second operand is considered to be positive.

The implied positive sign (1100 binary) and the source digits are placed at the first-operand location. The source digits are moved unchanged and are not checked for valid codes. The sign is placed in the rightmost four bit positions of the rightmost byte of the result field, and the digits are placed adjacent to the sign and to each other in the remainder of the result field.

The result is obtained as if the operands were processed right to left. When necessary, the second operand is considered to be extended on the left with zeros.

The length of the first operand is 16 bytes.

The byte length of the second operand is designated by the contents of the L2 field. The second-operand length must not exceed 32 characters or 64 bytes, and the byte length must be even (L2 must be less than or equal to 63 and must be odd); otherwise, a specification exception is recognized.

When the length of the second operand is 32 characters (64 bytes), the leftmost character is ignored.

PKU is described in the published description of the Pack Unicode instruction z/Architecture Principles of Operation having a document number of SA22-7832-03 with a "Build Date" of May 4, 2004 12:13:20 and a "Build Version" of 1.3.1 of "BUILD/VM Version: UG03935" and a Drop Date of Thursday Aug. 8, 2003.

PKA is a zSeries instruction that converts an ASCII string to packed format. The format of the PKA instruction is "PKA TARGET SOURCE (L2)" where L2 is the Length of the second operand ($0 \leq L2 \leq 31$). The length of the target is always 16 bytes.

The format of the second operand is changed from ASCII to packed, and the result is placed at the first-operand location. The packed format is described in Chapter 8, "Decimal Instructions."

The second-operand bytes are treated as containing decimal digits, having the binary encoding 0000-1001 for 0-9, in their rightmost four bit positions. The leftmost four bit positions of a byte are ignored. The second operand is considered to be positive.

The implied positive sign (1100 binary) and the source digits are placed at the first-operand location. The source digits are moved unchanged and are not checked for valid codes. The sign is placed in the rightmost four bit positions of the rightmost byte of the result field, and the digits are placed adjacent to the sign and to each other in the remainder of the result field.

The result is obtained as if the operands were processed right to left. When necessary, the second operand is considered to be extended on the left with zeros.

The length of the first operand is 16 bytes.

The length of the second operand is designated by the contents of the L2 field. The second-operand length must not exceed 32 bytes (L2 must be less than or equal to 31); otherwise, a specification exception is recognized.

When the length of the second operand is 32 bytes, the leftmost byte is ignored.

PKA is described in the published description of the Pack Unicode instruction found in the same published Principles of Operation manual cited above.

BRIEF SUMMARY

In accordance with one aspect of the present invention, as it relates to the PACK ASCII instruction, a computer program product for packing data is provided. The computer program product includes, for instance, a storage medium readable by a processing circuit and storing instructions for execution by the processing circuit for performing a method including, for instance, obtaining ASCII input data to be packed into memory, the ASCII input data including a plurality of blocks of ASCII data, wherein each block of ASCII data includes a plurality of ASCII characters; selecting a block of ASCII data to be packed, the selected block chosen from the plurality of blocks of ASCII data and including a plurality of bytes of data; performing one or more operations on the selected block of ASCII data to obtain a plurality of bytes of packed data; and repeating the selecting and the performing for a next selected block, one or more times, to obtain a packed array for the input data.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

Additional features and advantages are realized through the techniques of the present invention. Other embodiments and aspects of the invention are described in detail herein and are considered a part of the claimed invention.

The algorithm discussed in detail below in the description section is a block by block algorithm useful for converting UNICODE strings to a packed format. The algorithm works on both big-endian and small-endian machines. When timed for performance, block by block algorithms are much faster when compared to byte-by-byte methods. The algorithm that was initially considered was a byte-by-byte approach which was later improved to the block-by-block method using 8 byte blocks at a time.

The algorithm discussed in detail below in the description section is a block by block algorithm to convert an ASCII string to a packed format. The algorithm works on both big-endian and small-endian machines. When timed for performance, block by block algorithms are much faster when compared to byte by byte methods. The algorithm that was initially considered was a byte-by-byte approach which was later improved to the block by block method using 8 byte blocks at a time.

BRIEF DESCRIPTION OF THE SEVERAL VIEWS OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION

Figure 1:
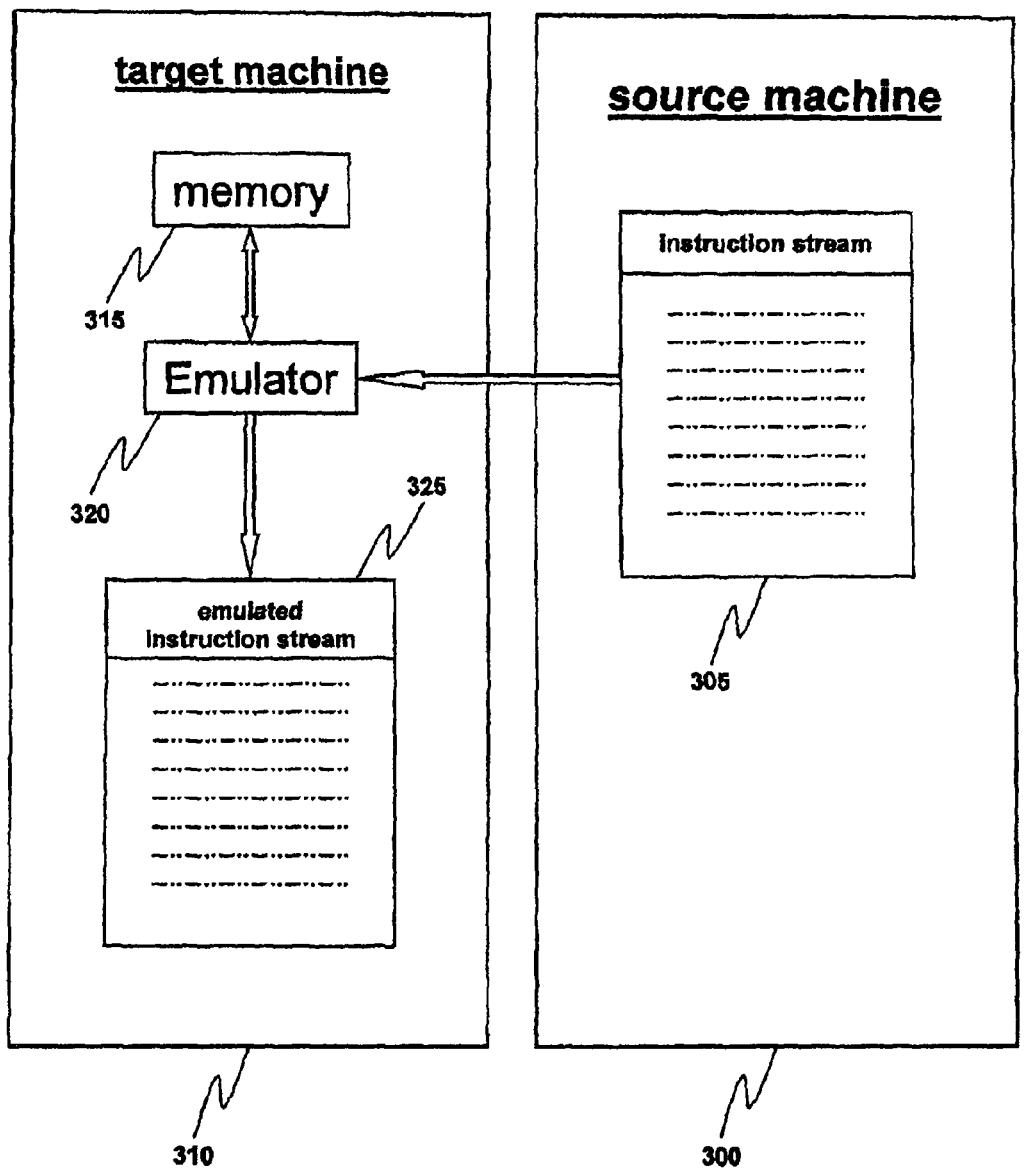
FIG. 1 is a block diagram illustrating the environment in which the present invention operates and is employed.

The typical emulation environment in which the present invention is employed is illustrated in FIG. 1. Emulators such as 320 accept as input instruction streams 305, representing machine or assembly language instructions which are designed to operate on source machine 300. Emulator 320 employs memory 315 in target machine 310 to produce a stream of instructions which are capable of executing on target machine 310. While FIG. 1 particularly shows operation within an emulation environment, it is also noted that the present invention contemplates a situation in which emulator 320 operates essentially as an interpreter in which the instructions are not only translated to the new architecture but in which they are also executed at essentially the same time.

Figure 2:
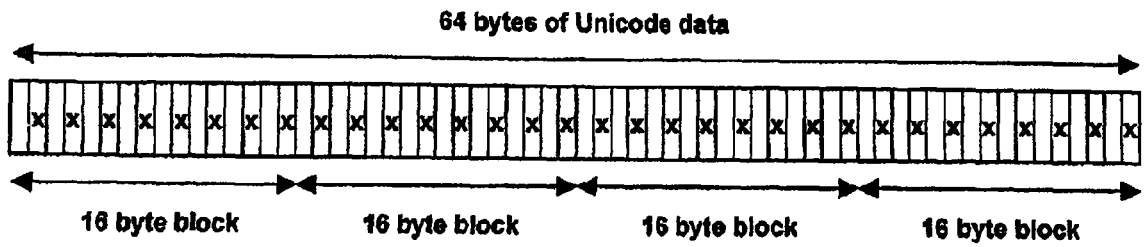
FIG. 2 is a block diagram illustrating the structure of a 64 byte chunk of Unicode structured data.
Figure 3:
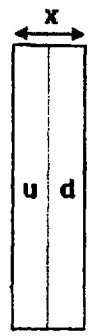
FIG. 3 is a block diagram more particularly illustrating the structure of a single byte of the rightmost portion of a Unicode character, that is, the rightmost of its two bytes and particularly showing its structure as two nibbles.
Figure 4:
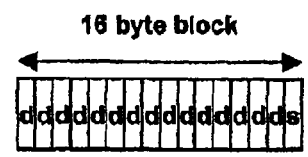
FIG. 4 is a block diagram illustrating the structure of Unicode originated data after its packed into a digits-only format together with a sign nibble.

Also, since the present invention is particularly concerned with packing instructions, FIG. 2 is provided so as to illustrate the structure of data which is typically supplied to a pack type of instruction. In particular, FIG. 2 illustrates the structure of 64 bytes of data representing 32 Unicode characters. In the present invention, data of this type would be processed in blocks of 16 bytes each. The "x" that is shown in the rightmost portion of each Unicode character (32 of them in all) represents that portion of a Unicode character which includes the encoding for a decimal digit (and more too which is ultimately discarded). The structure of such a rightmost Unicode character is more particularly illustrated in FIG. 3 in which it is seen that each of byte "x" is divided into two nibbles, an upper portion "u" and a lower or digit portion "d." These figures are presented this way due to size limitations as to the detail needed. In the PACK Unicode, instruction considered herein, the packaging process results in a structure such as that shown in FIG. 4 in which each of the digit nibbles are packed two-to-a-byte in a 16 byte block with the rightmost nibble of this block including the sign nibble.

Figure 5:
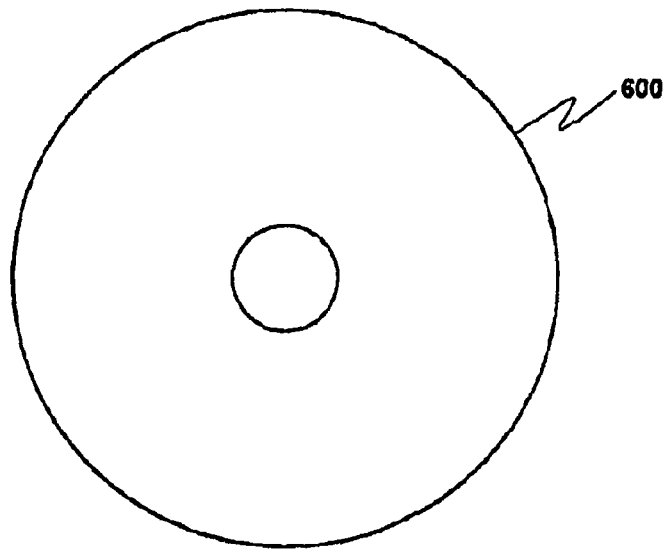
FIG. 5 is a top view of a typical computer readable medium containing program code which implements the methods of the present invention, as for example, as shown a Compact Disc (CD).

As pointed out above, the method of the present invention is embodied in its preferred form in the programming code set forth in the appendices one and two herein. Such programming is typically provided on a computer readable medium such as disk 600 shown in FIG. 5. However, it is also contemplated that such programming may also be distributed over any convenient data processing network.

The description of the emulation method for the PKU and the PKA instructions are discussed below. In this description, it is noted that reference to zMemory refers to memory locations in the target system which are employed for the purposes of the emulation process especially when the target machine has the zSeries architecture. However, it is noted that, in the methods provided below, zMemory is really just an exemplar and that any suitable memory in the target machine may be employed for this purpose.

As a further preliminary matter, in the description below: the symbol "&" represents a logical bitwise AND operation; the symbol "|" represents a logical bitwise OR operation; the symbol "<<" represents a logical bit wise LEFT SHIFT operation with the number to the right of "<<" indicating the number of bit positions to be shifted; and "0x" represents any single hexadecimal (four bit) digit (0000 through 1111); and "0F" represents the four bit hexadecimal digit which is all ones (that is, 1111) with "00" thus representing the hexadecimal digit which is all zeroes (that is, 0000).

The PKU instruction is discussed first.

PKU Instruction

The method described below is described in the C programming language and it works on both PowerPC-AIX (big endian) and Intel-L1NUX (small endian) architectures. The method described below is also shown in flow chart form in FIG. 6 wherein the step numbers are labeled as they are below. The block-by-block processing (as opposed to byte-by-byte processing) is carried out as follows:

(Step 105) Fetch input from zMemory to local array of size 66 bytes using proper offset; that is, copy L2 bytes from zMemory into local array+(64−L2).

(Step 110) Set source pointer to point to (local array+2). The source pointer type is unsigned long long (for 8 byte processing).

(Step 115) Set target pointer to point to pack array. The target pointer type is int (for 4 byte processing).

Figure 6:
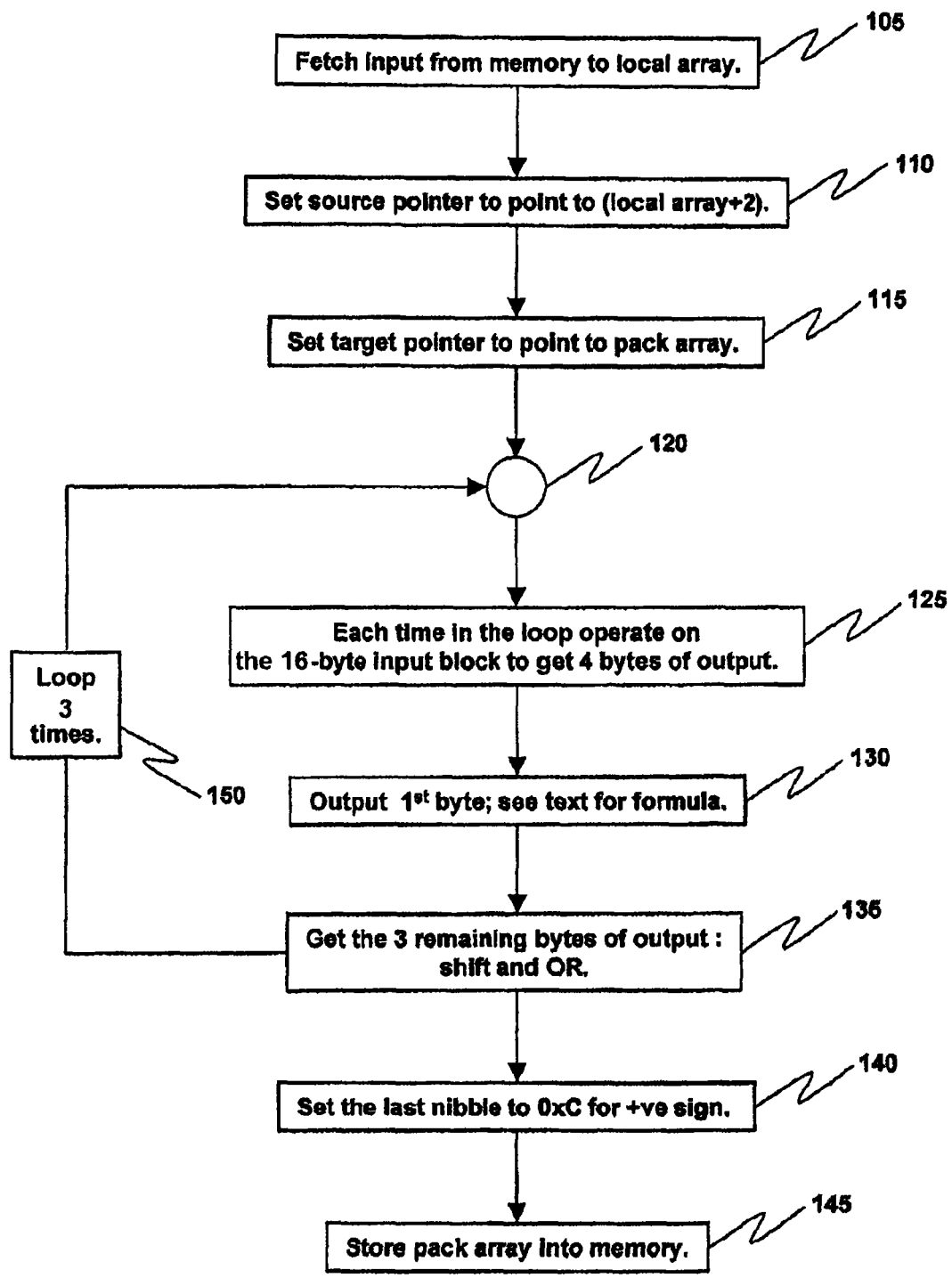
FIG. 6 is a block diagram illustrating the method employed for emulating the PKU instruction.

Do the Steps 130 and 135 below four times, each time in the loop operating on the 16-byte input block to get 4 bytes of output (Block 125 in FIG. 6). Block 120 in FIG. 6 represents the return point for this loop which passes through "counter" 150.

(Step 130) The first byte of output is computed as follows:
(((BLOCK & 0x000F000F000F000F)<<12)|((BLOCK & 0x000F000F000F000F)<<24)) & 0xFF0000000000000);
<<=this will be the first byte of output;

(Step 135) Get the three remaining bytes of output by shifting appropriately and then OR the byte to the 4-byte output block.

(Step 140) Set the last nibble to 0xC for a positive sign.

(Step 145) Store the pack array into zMemory.

The present method uses byte reversal functions whenever required to support both big-endian and little-endian architectures. The architecture for the most relevant source architecture, the zSeries of machines, is big-endian. Sample C code is given below in Appendix I where the input is assumed to be 64 bytes in length. Modifications to this code to accommodate other lengths is easily discerned.

PKA Instruction

The method described below is described in the C programming language and it works on both PowerPC-AIX (big endian) and Intel-L1NUX (small endian) architectures. The referenced method is also shown in flow chart form in FIG. 7 wherein the step numbers are labeled as they are below. The block-by-block processing (as opposed to byte-by-byte processing) is carried out as follows:

(Step 205) Copy input from zMemory to local array of size 33 bytes using proper offset; that is, copy L2 bytes from zMemory into local array+(32−L2).

(Step 210) Set source pointer to point to local array+1 and is of type unsigned long long (for 8 byte processing)

(Step 215) Set target pointer to point to pack array and is of type int (for 4 byte processing).

Figure 7:
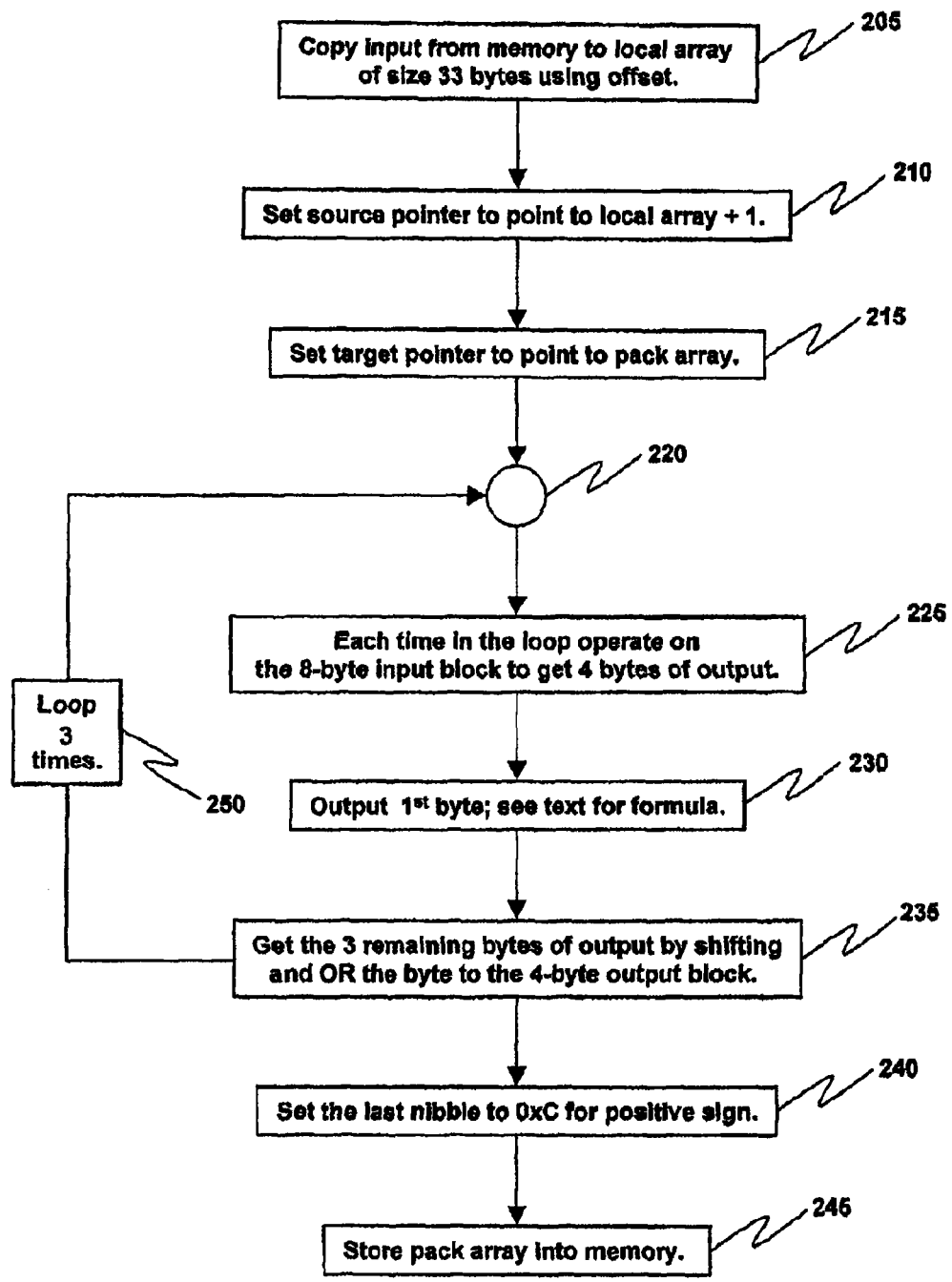
FIG. 7 is a block diagram illustrating the method employed for emulating the PKA instruction.

Do the Steps 230 and 235 below four times, each time in the loop operating on the 8-byte input block to get 4 bytes of output (Block 225 in FIG. 7). Block 220 in FIG. 7 represents the return point for this loop which passes through "counter" 250.

(Step 225) Each time in the loop operate on the 8-byte input block to get 4 bytes of output;

(Step 230) The first byte of output is calculated as follows:
(((BLOCK & 0x0F0F0F0F0F0F0F0F)<<4)|((BLOCK & 0x0F0F0F0F0F0F0F0F)<<4)) & 0xFF0000000000000);

(Step 235) Get the 3 remaining bytes of output by shifting appropriately and OR the byte to the 4-byte output block.

(Step 240) Set the last nibble to 0xC for positive sign.

(Step 245) Store pack array into zMemory

As above, to accommodate different architectures, when fetching and storing, byte reversal functions are used for big-endian and small-endian formats.

Figure 8:
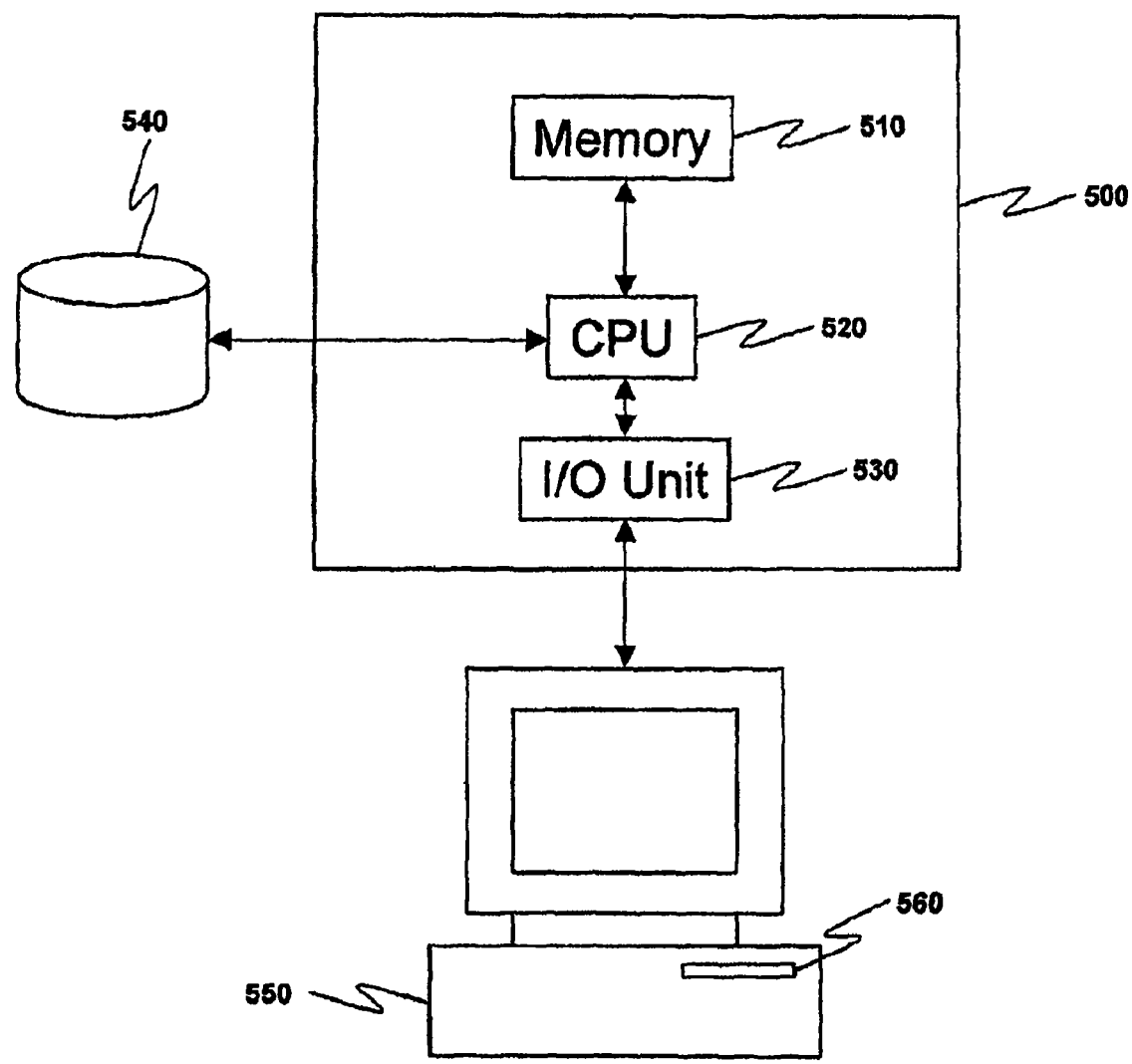
FIG. 8 is a block diagram illustrating an example of the environment in which the present invention is employed.

In any event the environment in which the present invention operates is shown in FIG. 8. The present invention operates in a data processing environment which effectively includes one or more of the computer elements shown in FIG. 8. In particular, computer 500 includes central processing unit (CPU) 520 which accesses programs and data stored within random access memory 510. Memory 510 is typically volatile in nature and accordingly such systems are provided with nonvolatile memory typically in the form of rotatable magnetic memory 540. While memory 540 is preferably a nonvolatile magnetic device, other media may be employed. CPU 530 communicates with users at consoles such as terminal 550 through Input/Output unit 530. Terminal 550 is typically one of many, if not thousands, of consoles in communication with computer 500 through one or more I/O unit 530. In particular, console unit 550 is shown as having included therein a device for reading medium of one or more types such as CD-ROM 600 shown in FIG. 5. Media 600 may also comprise any convenient device including, but not limited to, magnetic media, optical storage devices and chips such as flash memory devices or so-called thumb drives. Disk 600 also represents a more generic distribution medium in the form of electrical signals used to transmit data bits which represent codes for the instructions discussed herein. While such transmitted signals may be ephemeral in nature they still, nonetheless constitute a physical medium carrying the coded instruction bits and are intended for permanent capture at the signal's destination or destinations.

APPENDIX I

```
#include <stdio.h>
#include <time.h>
#include <byteswap.h>
#define ntohll(x)  bswap_64(x)
#define htonll(x)  bswap_64(x)
main( )
{
  char input[66]= {0x30,0x31,0x32,0x33,0x34,0x35,0x36,0x37,
              0x38,0x39,0x3A,0x3B,0x3C,0x3D,0x3E,0x3F,
```

APPENDIX I-continued

```
        0x3F,0x3E,0x3D,0x3C,0x3B,0x3A,0x39,0x38,
        0x37,0x36,0x35,0x34,0x33,0x32,0x31,0x39,
        0x30,0x31,0x32,0x33,0x34,0x35,0x36,0x37,
        0x38,0x39,0x3A,0x3B,0x3C,0x3D,0x3E,0x3F,
        0x3F,0x3E,0x3D,0x3C,0x3B,0x3A,0x39,0x38,
        0x37,0x36,0x35,0x34,0x33,0x32,0x31,0x39,
        0x00,0x00};
  char pack_array[16]= { 0x00,0x00,0x00,0x00,0x00,0x00,0x00,0x00,
        0x00,0x00,0x00,0x00,0x00,0x00,0x00,0x00};
    short int i;
  unsigned int *optr=(unsigned int *)pack_array;
  unsigned long long *iptr=(unsigned long long *)(input+2);
  for (i=0;i<4;i++,optr++,iptr=iptr+2)
    {
      *optr = htonl((((((ntohll(*iptr) &
            0x000F000F000F000FULL) << 12) |
            ((ntohll(*iptr) & 0x000F000F000F000FULL) << 24))) &
            0xFF00000000000000ULL)   |
            ((((((ntohll(*iptr) & 0x000F000F000F000FULL) << 12) |
            ((ntohll(*iptr) & 0x000F000F000F000FULL) << 24))) &
            0x00000000FF000000ULL) << 24) |
            ((((((ntohll(*(iptr+1)) & 0x000F000F000F000FULL) << 12) |
            ((ntohll(*(iptr+1)) & 0x000F000F000F000FULL) << 24))) &
            0xFF00000000000000ULL) >> 16) |
            ((((((ntohll(*(iptr+1)) & 0x000F000F000F000FULL) << 12) |
            ((ntohll(*(iptr+1)) & 0x000F000F000F000FULL) << 24))) &
            0x00000000FF000000ULL)) << 8)) >> 32;
    }
  optr--;
  *optr = htonl((ntohl(*optr) & 0xFFFFFFF0) | 0xC);
}
```

APPENDIX II

```
#include <stdio.h>
#include <time.h>
#include <byteswap.h>
#define ntohll(x)  bswap_64(x)
#define htonll(x)  bswap_64(x)
main( )
{
  char input [33] = {
              0x30,0x31,0x32,0x33,0x34,0x35,0x36,0x37,
              0x38,0x39,0x3A,0x3B,0x3C,0x3D,0x3E,0x3F,
              0x3F,0x3E,0x3D,0x3C,0x3B,0x3A,0x39,0x38,
              0x37,0x36,0x35,0x34,0x33,0x32,0x31,0x39,
              0x00};
  char pack_array[16] = {
              0x00,0x00,0x00,0x00,0x00,0x00,0x00,0x00,
              0x00,0x00,0x00,0x00,0x00,0x00,0x00,0x00};
  short int i;
  unsigned long long *iptr = (unsigned long long *)(input+1);
  unsigned int *optr = (unsigned int *)pack_array;
  for (i=0;i<4;i++,optr++,iptr++)
    {
      *optr = htonl((((((ntohll(*iptr) & 0x0F0F0F0F0F0F0F0FULL) |
            ((ntohll(*iptr) & 0x0F0F0F0F0F0F0F0FULL) << 4)) << 4) &
            0xFF00000000000000ULL) |
            (((((ntohll(*iptr) & 0x0F0F0F0F0F0F0F0FULL) |
            ((ntohll(*iptr) & 0x0F0F0F0F0F0F0F0FULL) << 4)) << 4) &
            0x0000FF0000000000ULL) << 8) |
            (((((ntohll(*iptr) & 0x0F0F0F0F0F0F0F0FULL) |
            ((ntohll(*iptr) & 0x0F0F0F0F0F0F0F0FULL) << 4)) << 4) &
            (((((ntohll(*iptr) & 0x0F0F0F0F0F0F0F0FULL) |
            ((ntohll(*iptr) & 0x0F0F0F0F0F0F0F0FULL) << 4)) << 4) &
            0x00000000FF000000ULL) << 16) |
            (((((ntohll(*iptr) & 0x0F0F0F0F0F0F0F0FULL) |
            ((ntohll(*iptr) & 0x0F0F0F0F0F0F0F0FULL) << 4)) << 4) &
            0x000000000000FF00ULL) << 24)) >> 32);
    }
  optr--;
  *optr = htonl((ntohl(*optr) & 0xFFFFFFF0) | 0xC);
}
```

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A computer program product for packing data, said computer program product comprising:
   a storage medium readable by a processing circuit and storing instructions for execution by the processing circuit for performing a method comprising:
      obtaining ASCII input data to be packed into memory, said ASCII input data comprising a plurality of blocks of ASCII data, wherein each block of ASCII data comprises a plurality of ASCII characters;
      selecting a block of ASCII data to be packed, said selected block chosen from the plurality of blocks of ASCII data and comprising a plurality of bytes of data;
      performing one or more operations on the selected block of ASCII data to obtain a plurality of bytes of packed data; and
      repeating the selecting and the performing for a next selected block, one or more times, to obtain a packed array for the input data.

2. The computer program product of claim 1, wherein the selected block comprises 8 bytes of data.

3. The computer program product of claim 1, wherein the selecting and the performing are performed four times to provide a total output of 16 bytes of packed data.

4. The computer program product of claim 1, wherein the performing one or more operations comprises performing one or more shift operations and one or more OR operations to obtain the plurality of bytes of packed data.

5. The computer program product of claim 1, wherein the method further comprises setting a sign, responsive to obtaining the packed array.

6. The computer program product of claim 5, wherein the method further comprises storing the packed array and the sign in memory.

7. The computer program product of claim 1, wherein the performing one or more operations on the selected block comprises performing:
   (((( BLOCK & 0x0F0F0F0F0F0F0F0F)|((BLOCK & 0x0F0F0F0F0F0F0F0F)<<4))<<4) & 0xFF00000000000000) to obtain a FIRST OUTPUT, where "BLOCK" represents said selected block, and the FIRST OUTPUT represents a first byte of packed data of the plurality of bytes of packed data.

8. The computer program product of claim 7, wherein the performing one or more operations on the selected block comprises performing:
   FIRST OUTPUT|((((BLOCK & 0x0F0F0F0F0F0F0F0F) |((BLOCK & 0x0F0F0F0F0F0F0F0F)<<4))<<8) & 0x0000FF0000000000) to obtain a SECOND OUTPUT, said SECOND OUTPUT representing the first and second byte of packed data of the plurality of bytes of packed data.

9. The computer program product of claim 8, wherein the performing one or more operations on the selected block comprises performing:
   SECOND OUTPUT|((((BLOCK & 0x0F0F0F0F0F0F0F0F)|((BLOCK & 0x0F0F0F0F0F0F0F0F)<<4))<<16) & 0x00000000FF000000) to obtain a THIRD OUTPUT, said THIRD OUTPUT representing the first, second and third byte of packed data of the plurality of bytes of packed data.

10. The computer program product of claim 9, wherein the performing one or more operations on the selected block comprises performing:

THIRD OUTPUT|((((BLOCK & 0x0F0F0F0F0F0F0F0F)|((BLOCK & 0x0F0F0F0F0F0F0F0F)<<4))<<24) & 0x000000000000FF00) to obtain a FOURTH OUTPUT, said FOURTH OUTPUT representing the first, second, third and fourth byte of packed data of the plurality of bytes of packed data.

11. A computer system for packing data, said computer system comprising:
 a memory; and
 a processor in communications with the memory, wherein the computer system is configured to perform a method, said method comprising:
  obtaining ASCII input data to be packed into memory, said ASCII input data comprising a plurality of blocks of ASCII data, wherein each block of ASCII data comprises a plurality of ASCII characters;
  selecting a block of ASCII data to be packed, said selected block chosen from the plurality of blocks of ASCII data and comprising a plurality of bytes of data;
  performing one or more operations on the selected block of ASCII data to obtain a plurality of bytes of packed data; and
  repeating the selecting and the performing for a next selected block, one or more times, to obtain a packed array for the input data.

12. The computer system of claim 11, wherein the selecting and the performing are performed four times to provide a total output of 16 bytes of packed data.

13. The computer system of claim 11, wherein the performing one or more operations comprises performing one or more shift operations and one or more OR operations to obtain the plurality of bytes of packed data.

14. The computer system of claim 11, wherein the performing one or more operations on the selected block comprises performing:

((((BLOCK & 0x0F0F0F0F0F0F0F0F)|((BLOCK & 0x0F0F0F0F0F0F0F0F)<<4))<<4) & 0xFF00000000000000) to obtain a FIRST OUTPUT, where "BLOCK" represents said selected block, and the FIRST OUTPUT represents a first byte of packed data of the plurality of bytes of packed data.

15. The computer system of claim 14, wherein the performing one or more operations on the selected block comprises performing:

FIRST OUTPUT|((((BLOCK & 0x0F0F0F0F0F0F0F0F) |((BLOCK & 0x0F0F0F0F0F0F0F0F)<<4))<<8) & 0x0000FF0000000000) to obtain a SECOND OUTPUT, said SECOND OUTPUT representing the first and second byte of packed data of the plurality of bytes of packed data.

16. The computer system of claim 15, wherein the performing one or more operations on the selected block comprises performing:

SECOND OUTPUT|((((BLOCK & 0x0F0F0F0F0F0F0F0F)|((BLOCK & 0x0F0F0F0F0F0F0F0F)<<4))<<16) & 0x00000000FF000000) to obtain a THIRD OUTPUT, said THIRD OUTPUT representing the first, second and third byte of packed data of the plurality of bytes of packed data.

17. The computer system of claim 16, wherein the performing one or more operations on the selected block comprises performing:

THIRD OUTPUT|((((BLOCK & 0x0F0F0F0F0F0F0F0F)|((BLOCK & 0x0F0F0F0F0F0F0F0F)<<4))<<24) & 0x000000000000FF00) to obtain a FOURTH OUTPUT, said FOURTH OUTPUT representing the first, second, third and fourth byte of packed data of the plurality of bytes of packed data.

18. A method for packing data, said method comprising:
 obtaining, by a processor, ASCII input data to be packed into memory, said ASCII input data comprising a plurality of blocks of ASCII data, wherein each block of ASCII data comprises a plurality of ASCII characters;
 selecting, by the processor, a block of ASCII data to be packed, said selected block chosen from the plurality of blocks of ASCII data and comprising a plurality of bytes of data;
 performing, by the processor, one or more operations on the selected block of ASCII data to obtain a plurality of bytes of packed data; and
 repeating the selecting and the performing for a next selected block, one or more times, to obtain a packed array for the input data.

19. The method of claim 18, wherein the selecting and the performing are performed four times to provide a total output of 16 bytes of packed data.

20. The method of claim 18, wherein the performing one or more operations on the selected block comprises performing:

((((BLOCK & 0x0F0F0F0F0F0F0F0F) ((BLOCK & 0x0F0F0F0F0F0F0F0F)<<4))<<4) & 0xFF00000000000000) to obtain a FIRST OUTPUT, where "BLOCK" represents said selected block, and the FIRST OUTPUT represents a first byte of packed data of the plurality of bytes of packed data;

FIRST OUTPUT|((((BLOCK & 0x0F0F0F0F0F0F0F0F) |((BLOCK & 0x0F0F0F0F0F0F0F0F)<<4))<<8) & 0x0000FF0000000000) to obtain a SECOND OUTPUT, said SECOND OUTPUT representing the first and second byte of packed data of the plurality of bytes of packed data;

SECOND OUTPUT|((((BLOCK & 0x0F0F0F0F0F0F0F0F) ((BLOCK & 0x0F0F0F0F0F0F0F0F)<<4))<<16) & 0x00000000FF000000) to obtain a THIRD OUTPUT, said THIRD OUTPUT representing the first, second and third byte of packed data of the plurality of bytes of packed data; and THIRD OUTPUT|((((BLOCK & 0x0F0F0F0F0F0F0F0F)|((BLOCK & 0x0F0F0F0F0F0F0F0F)<<4))<<24) & 0x000000000000FF00) to obtain a FOURTH OUTPUT, said FOURTH OUTPUT representing the first, second, third and fourth byte of packed data of the plurality of bytes of packed data.

* * * * *